SPARK GAP ELECTRONIC COMPONENT

Filed Aug. 5, 1965

Inventor
Leonard Sperry
By Pendleton, Neuman
Seibold & Williams
Attorneys

United States Patent Office 3,316,467
Patented Apr. 25, 1967

3,316,467
SPARK GAP ELECTRONIC COMPONENT

Leonard Sperry, Milwaukee, Wis., assignor to Globe-Union Inc., Milwaukee, Wis., a corporation of Delaware Filed Aug. 5, 1965, Ser. No. 477,530
12 Claims. (Cl. 317—256)

The present invention relates to an improved electronic component and to the method of manufacture thereof and more particularly, to an electronic component having improved physical and electrical characteristics which includes a spark gap for providing improved overvoltage protection and to the method of manufacture thereof.

The term "electronic components" is used in the industry to designate a wide variety of products utilized in the construction of electronic and electrical circuits. It is for all germane purposes synonymous with "electrical component." While the most common electrical components encountered are, perhaps, resistors, capacitors, and inductors, the gamut of components is unlimited and includes such things as vacuum tubes, transistors, connectors, printed circuit boards, circuit protective devices, such as fuses and spark gaps, transformers and the like. Such components are wired together or interconnected electrically to produce more complex components, circuits, and ultimately, complete electronic equipment.

It is often desirable to include overvoltage protection in components which are basically adapted for other purposes. One technique for providing overvoltage protection is to provide a small spark gap between conductive plates which form a part of the component so that in the event of excessive voltage an arc will be generated across the gap reducing the voltage thereacross before serious damage to the component results. Such a component is preferably self-healing once the excessive voltage is removed and the component will thus continue to function as before. One satisfactory component of this type which includes a combined resistor, capacitator and spark gap is shown in Magnusson et al. Patent No. 2,966,608.

A primary object of the present invention is to provide a new and improved electronic component and to provide an improved method for the manufacture of such electronic components. A more specific object is to provide a new and improved electronic component having a new and improved air gap formed therein to protect the component against overvoltage and to provide a new and improved method for the manufacture of such electronic components.

A further object of the present invention is to provide a new and improved electronic component having overvoltage protection which is capable of performing multiple functions, is simple, inexpensive, and reliable.

Still another object is to provide a new and improved method of manufacturing electrical components which facilitates the use of automatic practices and results in a more reliable and electrically stable product.

Additionally, an object of the present invention is to provide an electronic component having overvoltage protection which is self-restoring, easily maintained, cleanable, and is designed to avoid contamination and "tracking." "Tracking" is the formation of a low impedance current path as a result of arcing between the electrodes of a spark gap.

Still another object of the present invention is to provide a new and improved electronic circuit component having overvoltage protection which is controllable and wherein the voltage value at which the overvoltage protector functions can be readily controlled.

Other objects and advantages of the invention will become apparent upon reading the attached and detailed description taken in conjunction with the drawing.

In one form of the present invention, a ceramic disk is provided wherein conductive films are fused to oppose generally flat surfaces of the disk and wherein the conductive film associated with one of the surfaces has electrically separated portions. Terminating conductors are secured to the electrically separated portions of the conductive film on the one surface and are adapted for the formation of conductive connections in an electrical circuit. An air gap is provided in the ceramic disk intermediate the electrically separate portions of the conductive film on the one surface. The component may be encapsulated prior to or after the formation of the air gap in the ceramic disk. The present invention also relates to the method of manufacturing the electrical component.

For a more complete understanding of the present invention, reference will now be made to the drawings wherein.

Figures 1, 2, 3, 4, 5, 6:
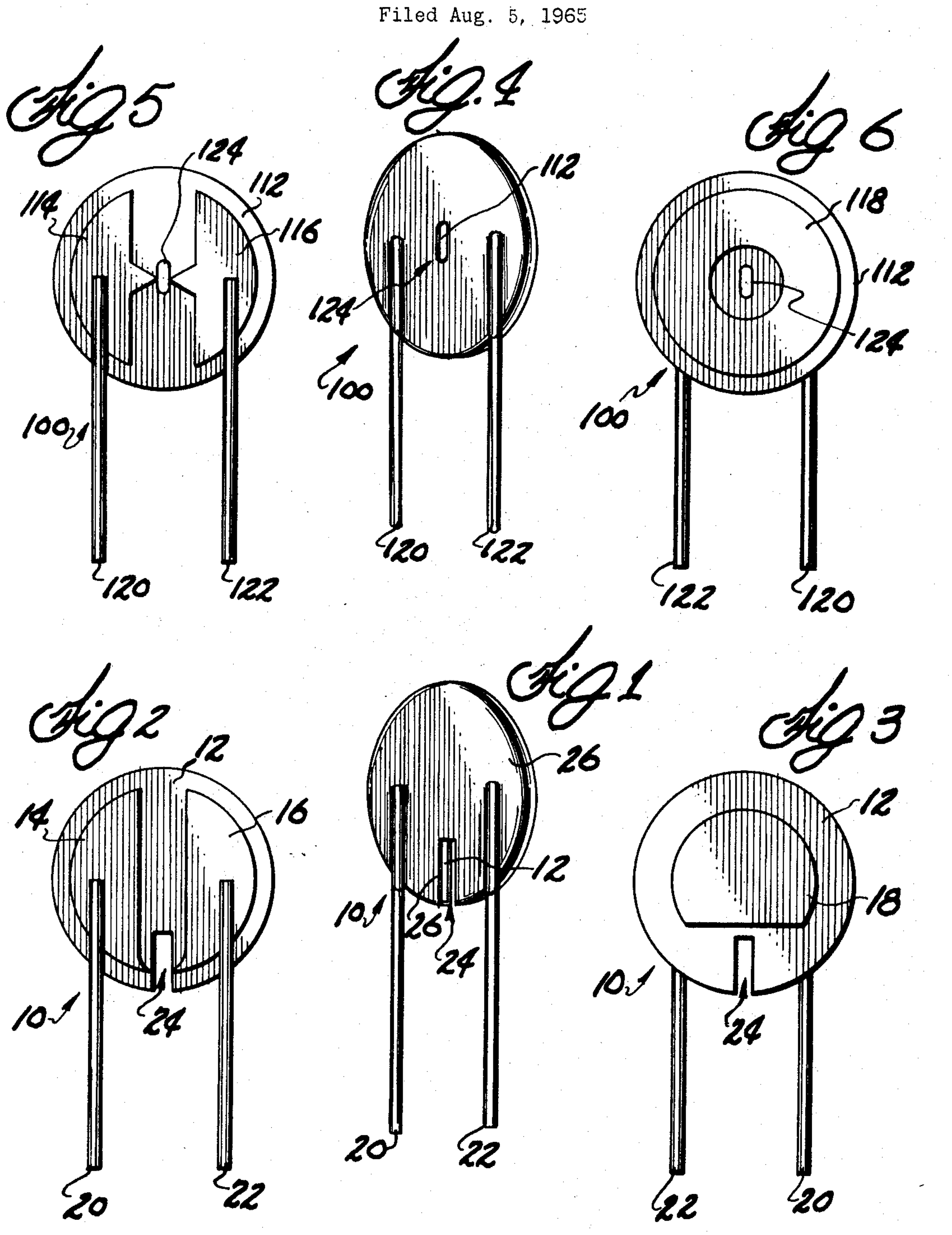
FIGURE 1 is a perspective view of a first electrical component constructed in accordance with the teachings of the present invention.
FIG. 2 is a front plan view of the component shown in FIG. 1 with the encapsulation removed therefrom.
FIG. 3 is a rear plan view of the component shown in FIG. 1 with the encapsulation removed therefrom.
FIG. 4 is a perspective view of a second electrical component constructed in accordance with the teachings of the present invention.
FIG. 5 is a front plan view of the component shown in FIG. 4 with the encapsulation removed therefrom.
FIG. 6 is a rear plan view of the component shown in FIG. 4 with the encapsulation removed therefrom.

While the invention has been shown and will be described in some detail with reference to particular exemplary embodiments thereof, there is no intention that it be limited to such detail. Quite to the contrary, it is intended here to embrace all modifications, alternatives, and equivalents falling within the spirit and scope of the invention as defined by the appended claims. For the purpose of this description the present invention will be described in connection with a capacitor and the method of manufacture thereof. However, it will be readily apparent that the present invention may be adapted to any desired electrical components which is to be protected against overvoltage.

Referring now to the drawing and more specifically to FIGS. 1–3 a capacitor 10 constructed in accordance with the teachings of the present invention is shown. The capacitor 10 includes a substantially flat insulating supporting body 12, having two generally parallel surfaces, which is in the form of a ceramic disk. A pair of electrically separated conductive electrodes 14 and 16 are disposed on one of the surfaces and a conductive electrode 18 is disposed on the opposite surface. Terminal conductors 20 and 22 have portions thereof respectively secured to the conductive electrodes 14 and 16 and have portions extending outwardly from the disk 12 which are adapted for the formation of conductive connections in an electrical circuit.

In accordance with the present invention an air gap or spark gap 24, shown in the form of a radially extending slot, is provided in the disk 12 adjacent the periphery thereof intermediate the electrically separated conductive electrodes 14 and 16. The disk 12, the conductive electrodes 14, 16 and 18 and the associated portions of the terminals 20 and 22 are encapsulated by a housing 26 except for the air gap 24 which is maintained exposed.

The disk 12 may be formed of any desired material, such as Steatite or other ceramic materials, and will generally have two accurately ground parallel surfaces to insure a predetermined capacitance when the ceramic becomes the dielectric of a completed capacitor. Steatite is desirable because of its electrical properties including its nontracking characteristics. For example, a typical ceramic capacitor having a diameter of about 3/8 inch will have a capacitance between 5 and 50 picofarads and a voltage breakdown of several thousand volts.

In one preferred form of manufacturing the described component of FIGS. 1–3, silver plates or disks which may be nickel-plated and gold immersion plated are applied to the two parallel faces of the disk 12 to define the electrodes 14, 16 and 18. The electrodes are fired onto the disk 12 by any of several known techniques. End portions of the terminals 20 and 22 are respectively fused to the electrodes 14 and 16 by any of several well-known techniques, also. These techniques include pasting or soldering. The connections between the terminals 20 and 22 and the electrodes 14 and 16 should be mechanically rigid and of very low electrical resistance. The air gap or slot 24 may be formed in the disk 12 prior to the time that the electrodes 14, 16 and 18 are secured thereto or may be formed therein after the electrodes are secured thereto. The component 10 may then be encapsulated with an appropriate weatherproof and stable insulating housing 26. Alternatively, the air gap or slot 24 may be formed in the disk 12 after the encapsulation of the component or at any time during the component manufacturing operation. However, in any event, the air gap is to be maintained exposed after the encapsulated component has been completed. Therefore, if the component is encapsulated after the air gap 24 is formed therein, the air gap must be cleaned to insure that it is maintained exposed. In one preferred manufacturing process, the component is encapsulated with a phenolformaldehyde resin, such as that commercially known as "Durez," with the air gap 24 being maintained exposed. Such an encapsulating housing will maintain the component free of contamination and degeneration from exposure to the atmosphere.

In one particular embodiment, the air gap 24 is formed to be approximately .016 inch wide so that a voltage breakdown characteristic is produced under normal ambient conditions which is on the order of 2,000 to 3,000 volts D.C.

From the foregoing, it will be apparent that the described method produces an improved electrical component in a more efficient and facile manner. It is also apparent that an improved product results wherein overvoltage protection may be provided by virtue of an air gap disposed within the main body portion of the component intermediate electrically separated electrodes associated with terminal conductors, the air gap being so disposed in the component to avoid excessive contamination and to facilitate cleaning and adjustment thereof if necessary.

The foregoing method may obviously be employed to manufacture many other components of combinations of components. For example, a parallel resistance may be included in the construction by locally doping the ceramic substance 12 to produce predetermined conductive characteristics between portions of the electrodes 14, 16 and 18. Also, if desired, a parallel resistance such as that described in the Magnusson et al. Patent No. 2,966,608 can be attained by applying a resistive paint to the surface and edge of the ceramic substrate 12 to suitably interconnect electrodes 14, 16 and 18.

Referring to FIGS. 4–6, a second embodiment of a capacitor 100 constructed in accordance with the teachings of the present invention is shown which is similar to the capacitor 10 shown in FIGS. 1–3. The capacitor 100 likewise includes a substantially flat insulating, supporting body 112, having two generally parallel surfaces, which is in the form of a ceramic disk. A pair of electrically separated conductive electrodes 114 and 116 are disposed on one of the surfaces and an annular conductive electrode 118 is disposed on the opposite surface. Terminal conductors 120 and 122 are provided which have portions thereof respectively secured to the conductive electrodes 114 and 116 and have portions adapted for the formation of conductive connections in an electrical circuit.

In accordance with the present invention an air gap or elongated hole 124 is provided substantially in the center of the disk 112 so that it extends through the open central portion of the annular electrode 118 and so that it extends intermediate the separated electrodes 114 and 116. The disk 112, the electrodes 114, 116 and 118, and the associated portions of the terminals 120 and 122 may likewise be encapsulated in an appropriate insulating material with the air gap 124 being maintained open and exposed.

The method of manufacturing the component 100 corresponds to that for the capacitor 10 and therefore the details thereof will not be set forth. However, it will be readily apparent that the air gap 124 may be provided in the disk 112 at any time during the manufacturing operation. For example, the air gap 124 may be formed in the disk 112 prior to the securing of the electrodes 114, 116 and 118 thereto or the air gap may be formed in the component subsequent to the encapsulation thereof. In the event the component is encapsulated subsequent to the formation of the air gap 124 therein, the air gap 124 must be cleaned subsequent to the encapsulating operation to insure that it is maintained exposed.

Without further elaboration the foregoing will so fully explain the character of the invention that others may by applying current knowledge, readily adapt the same for use under varying conditions of service, while retaining certain features which may properly be said to constitute the essential items of novelty involved, which items are intended to be defined and secured by the following claims.

What is claimed is:

1. A component for use in electrical circuits, which comprises an insulating supporting body at, least two conductive means secured to electrically separated portions of the supporting body, a pair of elongate terminating conductors each having a portion remote from one end thereof secured to a portion of one of the conductive means, the portions of the conductive means being electrically separated, said one end of the conductors being adapted for the formation of conductive connections in an electrical circuit, and an air gap extending through the supporting body intermediate those portions of the conductive means to which the conductors are secured which are closest to one another.

2. A component for use in electrical circuits, which comprises a supporting body, a pair of elongate terminating conductors each having a portion remote from one end thereof secured to the supporting body, said one end of the conductors being adapted for the formation of conductive connections in an electrical circuit, and an air gap extending through the supporting body intermediate those positions of the conductors which are closest to one another.

3. A component for use in electrical circuits, which comprises a substantially flat insulating supporting body having two generally parallel surfaces, conductive means secured to electrically separated portions of the surfaces, terminating conductors secured to electrically separated portions of the conductive means and adapted for the formation of conductive connections in an electrical circuit and an air gap extending through the supporting body intermediate the closet space portions of the conductive means to which electrically separated pairs of conductors are secured.

4. A component for use in electrical circuits, which comprises an insulating supporting body having two generally parallel surfaces, conductive means secured to the surfaces, the conductive means associated with at least one of the surfaces having electrically separated portions, terminating conductors secured to electrically separated portions of the conductive means and adapted for the formation of conductive connections in an electrical circuit, and an air extending through the supporting body between portions of the conductive means to which electrically separated pairs of conductors are secured.

5. A component for use in electrical circuits, which comprises a substantially flat insulating supporting body having two generally parallel surfaces, conductive means secured to electrically separated portions of the surfaces, an impedance element being defined between the conductive means, a pair of terminating conductors secured to electrically separated portions of the conductive means and adapted for the formation of conductive connections in an electrical circuit, and an air gap extending through the supporting body intermediate spaced portions of the conductive means to which the conductors are secured.

6. A component for use in electrical circuits, which comprises a substantially flat insulating supporting body having two generally parallel surfaces, conductive means secured to electrically separated portions of the surfaces and cooperating the body to define a capacitor, a pair of terminating conductors secured to electrically separated portions of the conductive means and adapted for the formation of conductive connections in an electrical circuit, and an air gap extending through the supporting body intermediate the portions of the conductive means to which the conductors are secured.

7. The component as recited in claim 6 wherein the air gap is defined by a radially extending slot formed in the outer peripheriphery of the supporting body.

8. The component as recited in claim 6 wherein the air gap is defined by an aperture formed in an intermediate portion of the supporting body.

9. The component as recited in claim 6 wherein encapsulating means are provided for enclosing the supporting body, the conductive means and the portions of the conductors secured to the conductive means with the exception of the air gap which is open.

10. The component as recited in claim 6 wherein the conductive means comprises two electrically separated conductive plates disposed on one of the surfaces to which the conductors are secured, and a conductive plate disposed on the other surface which cooperates with the body and the two plates to define two series connected capacitors.

11. The component as recited in claim 6 wherein the conductive means comprises two electrically separated generally semicircular conductive plates disposed on one of the surfaces to which the conductors are secured and a generally circular conductive plate disposed on the other surface which cooperates with the body and the two plates to define two series connected capacitors, and wherein the air gap is defined by a radially extending slot formed in the outer periphery of the body intermediate the semicircular plates and adjacent the circular plate.

12. The component as recited in claim 6 wherein the conductive means comprises two electrically separated generally semicircular conductive plates disposed on one of the surfaces to which the conductors are secured and a generally annular conductive plate disposed on the other surface which cooperates with the body and the two plates to define two series connected capacitors, and wherein the air gap is defined by an aperture formed in an intermediate portion of the body between the semicircular plates and which extends within the open central portion of the annular plate.

References Cited by the Examiner

UNITED STATES PATENTS

| | | | |
|---|---|---|---|
| 2,875,366 | 2/1959 | Bauman | 317—69 X |
| 2,966,608 | 12/1959 | Magnusson. | |
| 3,241,014 | 3/1966 | Rubinstein | 317—242 |

FOREIGN PATENTS

| | | |
|---|---|---|
| 882,405 | 11/1961 | Great Britain. |
| 1,134,164 | 9/1962 | Germany. |

LEWIS H. MYERS, *Primary Examiner*.

L. E. ASKIN, *Examiner*.

E. GOLDBERG, *Assistant Examiner*.

UNITED STATES PATENT OFFICE

CERTIFICATE OF CORRECTION

Patent No. 3,316,467 April 25, 1967

Leonard Sperry

It is hereby certified that error appears in the above numbered patent requiring correction and that the said Letters Patent should read as corrected below.

Column 1, line 14, for "electronic components" read -- electronic component --; line 38, for "capacitator" read -- capacitor --; column 2, line 44, for "components" read -- component --; column 3, line 55, for "of" read -- or --; line 58, for "substance" read -- substrate --; column 4, line 38, for "at," read -- , at --; line 57, for "positions" read -- portions --; line 66, for "circuit" read -- circuit, --; line 67, for "closet" read -- closest --; same line 67, for "space" read -- spaced --; column 5, line 3, after "air" insert -- gap --; line 20, after "cooperating" insert -- with --.

Signed and sealed this 21st day of November 1967.

(SEAL)
Attest:

EDWARD M.FLETCHER,JR.
Attesting Officer

EDWARD J. BRENNER
Commissioner of Patents